(12) United States Patent
Morken et al.

(10) Patent No.: US 6,657,707 B1
(45) Date of Patent: Dec. 2, 2003

(54) METALLURGICAL INSPECTION AND/OR ANALYSIS OF FLIP-CHIP PADS AND INTERFACES

(75) Inventors: David Bruce Morken, San Jose, CA (US); Raj Master, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 568 days.

(21) Appl. No.: 09/624,493

(22) Filed: Jul. 24, 2000

Related U.S. Application Data
(60) Provisional application No. 60/214,429, filed on Jun. 28, 2000.

(51) Int. Cl.[7] .................................................. G01N 1/00
(52) U.S. Cl. ..................... 356/36; 356/237.2; 356/237.5
(58) Field of Search ................. 356/36, 237.2, 356/237.3, 237.4, 237.5

(56) References Cited

U.S. PATENT DOCUMENTS

| | | | | |
|---|---|---|---|---|
| 5,184,768 A | * | 2/1993 | Hall et al. ................. 228/104 |
| 5,291,535 A | * | 3/1994 | Baker et al. ................. 378/22 |
| 5,458,281 A | * | 10/1995 | Downing et al. ............ 228/264 |
| 5,561,696 A | * | 10/1996 | Adams et al. ................ 378/58 |
| 5,581,632 A | * | 12/1996 | Koljonen et al. ............ 382/150 |
| 5,642,158 A | * | 6/1997 | Petry et al. ................. 348/87 |
| 5,886,362 A | * | 3/1999 | Millican et al. .............. 257/48 |
| 5,914,536 A | * | 6/1999 | Shizuki et al. .............. 257/778 |
| 6,013,572 A | * | 1/2000 | Hur et al. ................... 438/614 |
| 6,476,494 B1 | * | 11/2002 | Hur et al. ................... 257/762 |

* cited by examiner

Primary Examiner—Frank G. Font
Assistant Examiner—Roy M. Punnoose

(57) ABSTRACT

Raised electrical contacts, such as Pb-alloy solder bumps or balls utilized in semiconductor IC flip-chip devices, are selectively and readily removed from underlying contact pads by means of a chemical etching process, thereby facilitating metallurgical and/or microstructural inspection and/or analysis of the contact pads for failure analysis, void formation, electromigration, diffusion, loss of adhesion, etc., by a variety of optical and microscopic techniques.

20 Claims, 1 Drawing Sheet

METALLURGICAL INSPECTION AND/OR ANALYSIS OF FLIP-CHIP PADS AND INTERFACES

RELATED APPLICATIONS

This application claims priority from U.S. Provisional Application Ser. No. 60/214,429, filed Jun. 28, 2000, incorporated herein by reference.

FIELD OF THE INVENTION

The present invention relates to a method for performing metallurgical inspection and analysis of contact pads of semiconductor devices. More particularly, the present invention pertains to a method of sample preparation for performing metallurgical inspection and analysis of contact pads and interfaces in flip-chip semiconductor integrated circuit (IC) devices and assemblies, which method reveals pad surfaces and thus permits inspection and analysis of metallurgical structure, characteristics, and properties which are not otherwise feasible.

BACKGROUND OF THE INVENTION

An increasingly important aspect of semiconductor integrated circuit (IC) manufacturing technology is mounting of the semiconductor IC chip or die to an appropriate substrate. Frequently, this requires providing the chip or die with as many input/output ("I/O") terminals as is possible. As a consequence of the requirement for a large number of terminals to be formed on al limited amount of chip or die surfacer, so-called "flip-chip" structures and bonding techniques have been developed in order to provide high areal density interconnections between the IC chip or die and the substrate.

According to flip-chip methodology, the IC chip or die is mounted via direct bonding to the substrate. Generally, the flip-chip process entails disposing a plurality of solder balls or bumps on the upper major surface of the chip or die, "flipping " the chip or die over so that the solder balls or bumps face the substrate, mating them with corresponding bonding pads located on the substrate, and then heating the chip or die and the substrate to effect reflow of the solder bumps. Once reflowed, each solder ball or bump forms a bond between the chip or die and the corresponding bonding pad on the substrate, which bonded combination functions as both an electrical and physical contact.

A variant of the above-described flip-chip bonding technology, known as "controlled collapse chip connection" or "C4", is particularly useful in applications having a very high density of electrical interconnections. According to C4 methodology, electrically conductive balls or bumps comprising a solder material (i.e., alloy) are formed on the IC chip or die as well as on the mating surface of the substrate. Bonding between the two sets of solder balls or bumps is effected by application of heat and mechanical pressure to the chip or die and the substrate. The application of heat causes both sets of solder-based balls or bumps to reflow, thereby providing physical and ohmic connection therebetween, while the applied mechanical pressure causes the solder-based balls or bumps to at least partially collapse, creating a "pancake" shape which advantageously reduces interconnection length and resistance.

According to conventional manufacturing practices, e.g., with silicon (Si)-based semiconductor wafers, the solder-based balls or bumps are typically comprised of a lead (Pb)-based solder, e.g., a lead-tin (Pb—Sn) alloy such as of 97% Pb and 3% Sn (by weight), and are formed, as by use of vacuum or electrodeposition techniques, on electrically conductive contact pads comprising a multi-layer stack of metals, alloys, and phased-composition metal combinations. Referring to FIG. 1, schematically shown therein in cross-section is an example of a C4—type solder ball or bump formed on an underlying multi-layer contact pad. It should be recognized, however, that the various features and layers shown in the figure are not drawn to scale but are represented therein as to best illustrate the pertinent features thereof.

As shown in FIG. 1, C4—type solder ball or bump 8 is disposed over a major surface S of a semiconductor wafer 1 (or chip or die thereof), e.g., of silicon (Si). The ball or bump 8 may range in diameter from about 100 to about 200 μm and is preferably composed of the above-mentioned 97% Pb 3% Sn alloy. Intermediate the ball or bump 8 and wafer or chip surface S is an electrically conductive contact pad CP of multi-layer structure, comprised of at least four (4) vertically stacked layers, each of which is chosen for providing good mutual adhesion. The various component layers may be deposited by conventional techniques, such as sputtering, vacuum evaporation, CVD, etc. Contact pad CP includes, in overlying sequence from wafer or chip surface S: a series of layers, including adhesion and transition layers, e.g., an aluminum (Al) or Al-based layer 2; a chromium (Cr) or Cr-based layer adhesion 4; a chromium-copper (Cr—Cu) phased (i.e., heterogeneous) transition layer 6; and a copper (Cu) or Cu-based layer 7 for facilitating wetting by the Pb-based solder ball or bump 8 formed on the upper surface 7U thereof. In addition to these layers, a thin gold (Au) or Au-based layer may, if desired, be formed over Cu or Cu-based layer 7 for increasing corrosion/oxidation resistance of the contact.

Flip-chip contact arrangements, such as described above, are susceptible to exhibiting poor ohmic contact performance, or even failure, via several different mechanisms, including, inter alia, void formation, electromigration, intermetallic diffusion, adhesion loss, etc., necessitating performing a failure analysis and/or inspection with the aim of determining the particular mechanism responsible for the poor ohmic contact performance or failure. However, methodology for performing rapid, simple sample preparation for failure analysis and/or inspection of the various layers and interfaces constituting the flip-chip physical and electrical contact, is presently unavailable. Moreover, methodology which reveals all of the pertinent structure for enabling study and analysis of the metallurgy/microstructure of the various layers, alloys, interfaces, and intermetallics of flip-chip devices is considered of paramount significance in developing diagnostic procedures having as their aim the development of flip-chip electrical contacts having increased reliability and improved ohmic resistance characteristics.

Accordingly, there exists a need for improved methodology for reliable, rapid, and simple sample preparation for performing metallurgical analysis and/or inspection of electrical contact layers, surfaces, and interfaces between layers underlying solder bumps or balls in IC flip-chip devices, which methodology is capable of revealing all pertinent metallurgical and/or microstructural features of flip-chip contacts and does not require specialized, costly equipment or apparatus.

The present invention, wherein at least one solder bump or ball forming part of a contact arrangement of IC flip-chip device is selectively removed, as by a room temperature chemical etching process, to reveal the surface of the underlying multi-layer contact pad and render it and its various component layers and interfaces therebetween accessible to a variety a metallurgical, microstructural, and other type analytical and inspection tests and procedures, effectively addresses the need for improved methodology for development of reliable, adherent, low ohmic resistance flip-chip contacts and devices. Further, the means and methodology provided by the present invention enjoy diverse utility in the manufacture of numerous types of electrical and electronic devices provided with raised contacts.

DISCLOSURE OF THE INVENTION

An advantage of the present invention is an improved method for simple, reliable, and rapid sample preparation of flip-chip devices for metallurgical analysis and/or testing of electrical contact layers, surfaces, and interfaces.

Another advantage of the present invention is an improved method for performing metallurgical analysis and/or inspection of electrical contact layers, surfaces, and interfaces underlying solder balls or bumps of electrical or electronic devices.

Yet another advantage of the present invention is an improved method of performing metallurgical analysis and/or inspection of electrical contact pad layers, surfaces, and interfaces underlying Pb-based solder bumps or balls of a flip-chip semiconductor IC device.

Additional advantages and other features of the present invention will be set forth in the description which follows and in part will become apparent to those having ordinary skill in the art upon examination of the following or may be learned from the practice of the present invention. The advantages of the present invention may be realized as particularly pointed out in the appended claims.

According to one aspect of the present invention, the foregoing and other advantages are obtained in part by a method of performing metallurgical analysis and/or inspection of electrical contact layers, surfaces, and/or interfaces underlying a solder bump or ball, comprising the steps of:

(a) providing an electrical or electronic device comprising at least one raised electrical contact formed on a surface of the device, the at least one raised electrical contact comprising an electrically conductive contact pad formed in contact with the surface of the device and a solder bump or ball formed on an upper surface of the contact pad;

(b) selectively removing the solder bump or ball to thereby expose the upper surface of the contact pad; and (c) performing metallurgical and/or microstructural analysis and/or inspection of components of the contact pad, including the upper surface and any underlying layers and interfaces between different layers thereof.

According to embodiments of the present invention, step (a) comprises providing an electronic device in the form of a semiconductor integrated circuit (IC) chip or die, e.g., an IC chip or die having at least one raised electrical contact comprising a lead-tin (Pb—Sn) solder bump or ball formed on a major surface thereof.

According to further embodiments of the present invention, the at least one Pb—Sn solder bump or ball comprises a 97% Pb—3% Sn alloy, the IC chip is a silicon (Si)-based chip, and the contact pad comprises a multi-layer stack, including, in overlying sequence from the major surface of the IC chip or die:

an aluminum (Al) or Al-based layer;

a chromium (Cr) or Cr-based adhesion layer;

a chromium-copper (Cr—Cu) phased transition layer; and a Cu or Cu-based layer.

The multi-layer stack may, if desired, further include a gold (Au) or Au-based layer over the Cu or Cu-based layer.

According to embodiments of the present invention, step (b) comprises removing the at least one solder bump or ball by means of an etching process, e.g., by performing a room temperature chemical etching process utilizing a 1:1 mixture of 70% acetic acid ($CH_3COOH$) and 70% hydrogen peroxide ($H_2O_2$); step (b) further comprising rinsing and drying the device subsequent to performing the chemical etching process to remove etchant and etching residue therefrom, and performing a post-etching inspection of the device for determining the completeness of removal of the at least one solder bump or ball.

According to further embodiments of the present invention, step (b) further comprises performing additional room temperature chemical etching utilizing the $CH_3COOH$—$H_2O_2$ mixture, if necessary, based upon the result of the post-etching inspection, in order to remove any remaining portions of the at least one solder bump or ball.

According to embodiments of the present invention, step (c) includes performing analysis and/or inspection of the contact pad for at least one of void formation, electromigration, diffusion, adhesion failure, and for observation of grain structures, e.g., by performing or utilizing at least one inspection and/or analysis method and/or apparatus selected from metallographic analysis, optical spectroscopy, scanning electron microscopy (SEM), 3-dimensional image analysis, X-ray spectroscopy (XRS), energy dispersive spectroscopy (EDS), and wavelength dispersive spectroscopy (S).

According to another aspect of the present invention, a method of performing metallurgical and/or microstructural analysis and/or inspection of electrical contact pad surfaces, layers, and/or layer interfaces underlying a Pb alloy-based solder bump or ball of a flip-chip semiconductor device, comprising the steps of:

(a) providing a semiconductor integrated circuit (IC) flip-chip device comprising at least one raised electrical contact formed on a major surface thereof, the at least one raised electrical contact comprising an electrically conductive, stacked multi-layer contact pad formed in contact with the major surface of the flip-chip and a Pb—Sn alloy solder bump or ball formed on an upper surface of the contact pad;

(b) selectively removing the Pb—Sn solder bump or ball by means of a chemical etching process to thereby expose the upper surface of the contact pad; and (c) performing metallurgical and/or microstructural analysis and/or inspection of the components of the contact pad, including the upper surface, component layers, and layer interfaces thereof.

According to embodiments of the present invention, step (a) comprises providing a silicon (Si)-based IC flip-chip device, the at least one Pb—Sn solder bump or ball is comprised of a 97% Pb—3% Sn alloy, and the contact pad is in the form of a multi-layer stack comprising, in overlying sequence from the major surface of the IC flip-chip device:

an aluminum (Al) or Al-based layer;

a chromium (Cr) or Cr-based adhesion layer;

a chromium-copper (Cr—Cu) phased transition layer;

a copper (Cu) or Cu-based layer; and a gold (Au) or Au-based layer.

According to embodiments of the present invention, step (b) comprises selectively removing the at least one Pb—Sn alloy solder bump or ball by performing a room temperature chemical etching process utilizing a 1:1 mixture of 70% acetic acid ($CH_3COOH$) and 70% hydrogen peroxide ($H_2O_2$); step (b) further comprising water rinsing and drying the flip-chip device subsequent to performing the chemical etching process to remove etchant and etching residue therefrom, and performing a post-etching inspection thereof for determining the completeness of removal of the at least one solder bump or ball.

According to further embodiments of the present invention, step (b) further comprises performing additional room temperature chemical etching utilizing the $CH_3COOH$—$H_2O_2$ mixture, if necessary, based upon the result of the post-etching inspection, in order to remove any remaining portions of the at least one Pb—Sn solder bump or ball.

According to embodiments of the present invention, step (c) includes performing analysis and/or inspection of the contact pad for at least one of void formation, electromigration, diffusion, adhesion failure, and for observation of grain structures, e.g., by performing or utilizing at least one inspection or analysis method or apparatus selected from metallographic analysis, optical microscopy, scanning electron microscopy (SEM), 3-dimensional image analysis, X-ray spectroscopy (XRS), energy dispersive spectroscopy (EDS), and wavelength dispersive spectroscopy (WDS).

Additional advantages and aspects of the present invention will become readily apparent to those skilled in the art from the following detailed description, wherein embodiments of the present invention are shown and described, simply by way of illustration of the best mode contemplated for practicing the present invention. As will be described, the present invention is capable of other and different embodiments, and its several details are susceptible of modification in various obvious respects, all without departing from the spirit of the present invention. Accordingly, the drawings and description are to be regarded as illustrative in nature, and not as limitative.

BRIEF DESCRIPTION OF THE DRAWING

The following detailed description of the embodiments of the present invention can best be understood when read in conjunction with the following drawing, in which the various features are not drawn to scale but rather are drawn as to best illustrate the pertinent features, wherein.

DESCRIPTION OF THE INVENTION

Figure 1:
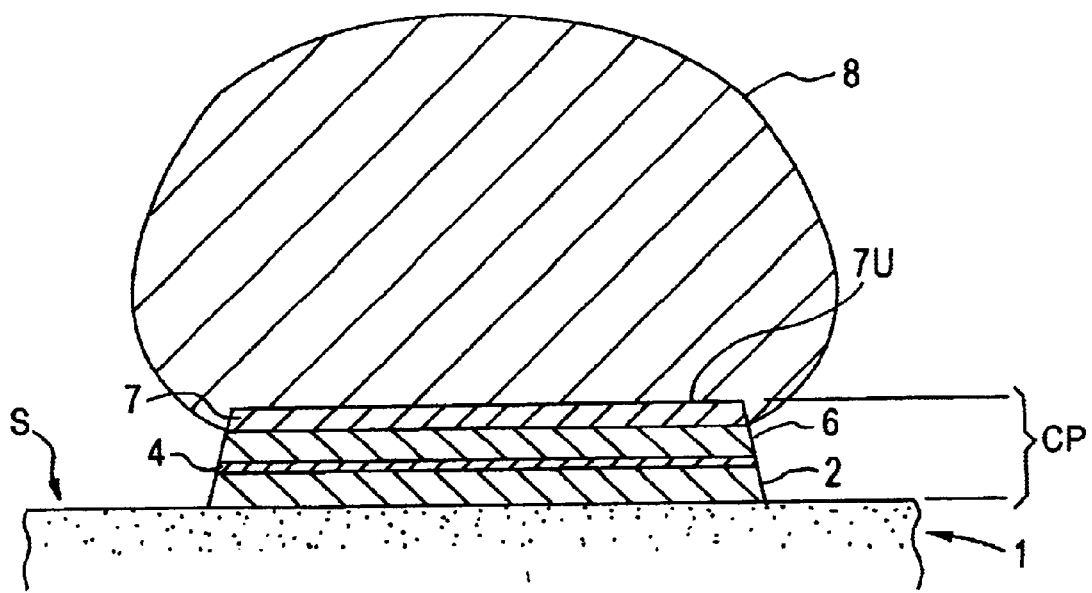
FIG. 1 schematically illustrates, in cross-sectional view, a raised contact structure suitable for use in practice of the present invention.

The present invention is based upon the discovery that raised electrical contacts, comprised of, for example, lead alloy-based solder bumps or balls formed on the surface of an electrical or electronic device package or chip, such as a flip-chip device, can be selectively and readily removed in a non-destructive manner, in order to reveal all aspects, features, and/or components of the underlying contact pad structure, thereby facilitating metallurgical and/or microstructural inspection and/or analysis thereof for determining contact failure mechanisms, void formation, loss of layer adhesion, poor ohmic resistance, etc.

According to the present invention, an electrical or electronic device having at least one raised contact formed on a surface thereof, e.g., a packaged (i.e., encapsulated) semiconductor device or a semiconductor (e.g., silicon-based) IC device of flip chip type, is subjected to a process for selectively removing the raised contact portion from an underlying contact pad portion, without incurring damage to or otherwise affecting the contact pad structure.

By way of illustration only, and with reference to FIG. 1, in the case of raised contacts consisting of solder bumps or balls 8 of diameter typically formed on the surface S of semiconductor IC flip-chip devices (e.g., 100–200 $\mu$m) and comprised of a Pb—Sn alloy, e.g., 97% Pb—3% Sn, selective removal thereof may be effected, without harm or transformation of the underlying contact pad CP structure, by an about 30 min. immersion in a room temperature etchant comprising a 1:1 mixture of 70% $CH_3COOH$ and 70% $H_2O_2$. Following etching, the device is rinsed, e.g., with $H_2O$, to remove etchant and etching debris therefrom, dried (e.g., by a flow of compressed air or nitrogen), and visually inspected for determining the completeness of removal of the solder bumps or balls from the upper surface 7U of uppermost Cu or Cu-based layer 7 (or a thin Au or Au-based layer formed thereon). Should the post-etching inspection reveal any remaining portion(s) of the solder bumps or balls, additional room temperature etching in the $CH_3COOH$—$H_2O_2$ mixture is performed as required, followed by $H_2O$ rinsing and drying. Given the disclosure and objectives of the present invention, determination and selection of other chemical etchants for use in a particular application (e.g., with other solder alloys) is considered within the ambit of the routineer.

Upon completion of etching as described above for revealing the entire upper surface 7U of uppermost Cu or Cu-based layer 7 (or optional thin Au or Au-based layer thereon) of contact pad CP, the sample is subjected to analysis and/or inspection of the upper, exposed surface 7U of the contact pad CP layer stack, as well as the component layers 2, 4, 6, and 7 and each of the interfaces therebetween, in order to pinpoint the failure mechanism or mode, and analyze for one or more of void formation, electromigration, diffusion, layer adhesion loss, high ohmic resistance, and metallurgical properties and microstructural characteristics, e.g., grain size, shape, and boundaries.

A variety of conventional analysis and inspection techniques and apparatus therefor may be utilized for studying the various surfaces, layers, and interfaces of the contact pad CP, including, inter alia, metallography, optical microscopy, scanning electron microscopy (SEM), 3-dimensional image analysis, X-ray spectroscopy (XRS), energy dispersive spectroscopy (EDS), and wavelength dispersive spectroscopy (WDS).

A number of advantages are thus provided by the inventive methodology, including, inter alia, permitting use of a variety of diagnostic tools and techniques for performing failure analysis and pinpointing failure mode, facilitating evaluation of flip-chip interface structure for development of improved and more reliable electrical interfaces, and the ability to access metallurgical structure for inspection and analysis thereof which is not otherwise observable. In addition, the inventive methodology is rapid, simple, and conveniently performed, without incurring significant expense for additional equipment, chemicals, etc. Further, the inventive methodology is not limited to use with semiconductor IC flip-chip devices, but rather is applicable to performing rapid, safe, and reliable sample preparation of all manner of electrical and electronic devices and/or components having raised contact structures.

In the previous description, numerous specific details have been set forth, such as specific materials, structures, processes, reactants, etc., in order to provide a better understanding of the present invention. However, the present invention can be practiced without resorting to the details specifically set forth. In other instances, well-known processing techniques and structures have not been described in detail in order not to unnecessarily obscure the present invention.

Only the preferred embodiments of the present invention and but a few examples of its versatility are shown and described in the present invention. It is to be understood that the present invention is capable of use in various other combinations and environments and is susceptible of changes and/or modifications within the scope of the inventive concept as expressed herein.

What is claimed is:

1. A method of performing metallurgical analysis and/or inspection of electrical contact layers, surfaces, and/or interfaces underlying a solder bump or ball, comprising the steps of:

(a) providing an electrical or electronic device comprising at least one raised electrical contact formed on a surface of said device, said at least one raised electrical contact comprising an electrically conductive contact pad formed in contact with said surface of said device and a solder bump or ball formed on an upper surface of said contact pad;

(b) selectively removing said solder bump or ball to thereby expose said upper surface of said contact pad; and (c) performing metallurgical and/or microstructural analysis and/or inspection of components of said contact pad, including said upper surface and any underlying layers and interfaces between different layers thereof.

2. The method as in claim 1, wherein:

step (a) comprises providing an electronic device in the form of a semiconductor integrated circuit (IC) chip or die.

3. The method as in claim 2, wherein:

step (a) comprises providing an IC chip or die having at least one raised electrical contact comprising a lead-tin (Pb—Sn) solder bump or ball formed on a major surface thereof.

4. The method as in claim 3, wherein:

step (a) comprises providing an IC chip or die wherein said at least one Pb—Sn solder bump or ball is comprised of a 97% Pb—3% Sn alloy.

5. The method as in claim 4, wherein:

step (a) comprises providing a silicon (Si)-based IC chip or die and said contact pad comprises a multi-layer stack.

6. The method as in claim 5, wherein said multi-layer stack comprises, in overlying order from said major surface of said IC chip or die:

an aluminum (Al) or Al-based layer;

a chromium (Cr) or Cr-based adhesion layer;

a chromium-copper (Cr—Cu) phased transition layer; and a Cu or Cu-based layer.

7. The method as in claim 6, wherein said multi-layer stack further comprises a gold (Au) or Au-based layer over said Cu or Cu-based layer.

8. The method as in claim 1, wherein:

step (b) comprises selectively removing said at least one solder bump or ball by performing an etching process.

9. The method as in claim 8, wherein:

step (b) comprises performing a room temperature chemical etching process utilizing a 1:1 mixture of 70% acetic acid ($CH_3COOH$) and 70% hydrogen peroxide ($H_2O_2$).

10. The method as in claim 8, wherein:

step (b) further comprises rinsing and drying said device subsequent to performing said chemical etching process to remove etchant and etching residue therefrom, and performing a post-etching inspection of said device for determining the completeness of removal of said at least one solder bump or ball.

11. The method as in claim 10, wherein:

step (b) further comprises performing additional room temperature chemical etching utilizing said acetic acid-hydrogen peroxide mixture, if necessary, based upon the result of said post-etching inspection, in order to remove any remaining portion(s) of said at least one solder bump or ball.

12. The method as in claim 1, wherein:

step (c) includes performing analysis and/or inspection of said contact pad for at least one of void formation, electromigration, diffusion, adhesion failure, and for observation of grain structures.

13. The method as in claim 12, wherein:

step (c) comprises performing or utilizing at least one inspection or analysis method or apparatus selected from metallographic analysis, optical microscopy, scanning electron microscopy (SEM), 3-dimensional image analysis, X-ray spectroscopy (XRS), energy dispersive spectroscopy (EDS), and wavelength dispersive spectroscopy (WDS).

14. A method of performing metallurgical and/or microstructural analysis and/or inspection of electrical contact pad surfaces, layers, and/or layer interfaces underlying a Pb-based solder bump or ball of a flip-chip semiconductor device, comprising the steps of:

(a) providing a semiconductor integrated circuit (IC) flip-chip device comprising at least one raised electrical contact formed on a major surface thereof, said at least one raised electrical contact comprising an electrically conductive, stacked multi-layer contact pad formed in contact with said major surface of said flip-chip device and a Pb—Sn alloy solder bump or ball formed on an upper surface of said contact pad;

(b) selectively removing said Pb—Sn solder bump or ball my means of a chemical etching process to thereby expose said upper surface of said contact pad; and (c) performing metallurgical and/or microstructural analysis and/or inspection of the components of said contact pad, including said upper surface, component layers, and layer interfaces thereof.

15. The method as in claim 14, wherein:

step (a) comprises providing a silicon (Si)-based IC flip-chip device, said at least one Pb—Sn solder bump or ball is comprised of a 97% Pb—3% Sn alloy, and said contact pad is in the form of a multi-layer stack comprising, in overlying sequence from said major surface of said IC flip chip device:

an Al or Al-based layer;

a Cr or Cr-based adhesion layer;

a Cr—Cu phased transition layer;

a Cu or Cu-based layer; and an Au or Au-based layer.

16. The method as in claim 15, wherein:

step (b) comprises selectively removing said at least one Pb—Sn alloy solder bump or ball by performing a room temperature chemical etching process utilizing a 1:1 mixture of 70% acetic acid ($CH_3COOH$) and 70% hydrogen peroxide ($H_2O_2$).

17. The method as in claim 16, wherein:

step (b) further comprises water rinsing and drying said flip-chip subsequent to performing said chemical etching process to remove etchant and etching residue therefrom, and performing a post-etching inspection thereof for determining the completeness of removal of said at least one solder bump or ball.

18. The method as in claim 17, wherein:

step (b) further comprises performing additional room temperature chemical etching utilizing said $CH_3COOH$—$H_2O_2$ mixture, if necessary, based upon the result of said post-etching inspection, in order to remove any remaining portion(s) of said at least one Pb—Sn solder bump or ball.

19. The method as in claim 18, wherein:

step (c) includes performing analysis and/or inspection of said contact pad for at least one of void formation, electromigration, diffusion, adhesion failure, and for observation of grain structures.

20. The method as in claim 19, wherein:

step (c) comprises performing or utilizing at least one inspection or analysis method or apparatus selected from metallographic analysis, optical microscopy, scanning electron microscopy (SEM), 3-dimensional image analysis, X-ray spectroscopy (XRS), energy dispersive spectroscopy (EDS), and wavelength dispersive spectroscopy (WDS).

* * * * *